June 5, 1962 A. PROUDFIT 3,038,072

AUTOMATIC-GAIN AND BANDWIDTH CONTROL SYSTEM FOR TRANSISTOR CIRCUITS

Filed Nov. 19, 1959

3,038,072
Patented June 5, 1962

3,038,072

AUTOMATIC-GAIN AND BANDWIDTH CONTROL SYSTEM FOR TRANSISTOR CIRCUITS

Alexander Proudfit, Glen Cove, N.Y., assignor to Hazeltine Research, Inc., a corporation of Illinois Filed Nov. 19, 1959, Ser. No. 854,089
5 Claims. (Cl. 250—20)

This invention pertains to automatic-gain-control systems for wave signal receivers, and particularly to an automatic-gain-control system for a receiver employing transistor signal amplifiers.

Automatic-gain-control of a wave signal receiver which has vacuum tube intermediate-frequency (IF) amplifiers is obtained by applying thereto a control bias dependent on the average signal amplitude. This bias alters the signal gain of each amplifier in an opposite sense from that of a change in signal strength. The gains of the converter and radio-frequency (RF) amplifier may be similarly controlled. The amplitude of the amplified signal reaching the second detector is thus maintained substantially constant. Since the gain-control bias has little effect on the input and output impedances of any amplifier stage the bandwidth of the receiver also remains constant.

In a receiver employing transistor IF amplifiers, however, such automatic-gain-control systems are not as effective because the current gain of a transistor changes relatively slowly in response to a change in the base or emitter bias from the quiescent value thereof corresponding to maximum gain. In addition, a controlled reduction in forward bias with increasing signal strength will increase the input and output impedances of a transistor amplifier, thus reducing the bandwidth of the receiver. An accompanying problem is that when more than one transistor IF amplifier stage is employed the relatively poor gain-control sensitivity of the first stage often leads to signal overload distortion in following stages.

It has been suggested that improved automatic-gain-control (A.G.C.) operation of a signal receiver having a transistor IF amplifier may be obtained by utilizing the gain-control bias voltage to reduce the impedance of a diode connected across the primary winding of the IF transformer which couples the frequency converter stage to the amplifier. When the received signal strength increases, the reduced loading of the secondary winding due to the increased control bias applied to the IF amplifier will then be offset by the increased loading of the primary winding by the diode. A more nearly constant IF bandwidth is thus obtained. An automatic-gain-control system of this type is disclosed in Patent 2,774,866 to F. J. Burger, issued December 18, 1956.

Although such circuits do obtain improved operation, as described, they have the disadvantage that establishment of a particular degree of gain-control sensitivity requires coordinated design and operation of the stage preceding the one it is desired to control. In many cases the requisite threshold and quiescent values of the control bias and the degree of variation thereof with changing signal strength are incompatible with the voltage and impedance levels required for efficient operation of the converter or other preceding stage. Indeed, in some transistor receivers the converter and IF amplifier transistors may be portions of a multiple zone semiconductor device wherein the collector terminal of the converter and the emitter terminal of the first IF amplifier share a common zone, thus making it impossible to set them at the different voltage levels which may be required. The prior art also fails to solve the problem of assuring an adequate range of control bias variation to stabilize the receiver against the possible range of received signal strength variation.

Accordingly, one of the objects of the present invention is to provde an automatic-gain-control system for a wave signal receiver including a transistor amplifier and which is capable of providing a selected degree of receiver gain and bandwidth stabilization against variations in received signal strength.

A further object is to provide an automatic-gain-control system for obtaining more sensitive control of the degree of gain and bandwidth stabilization of one or more transistor amplifier stages of a wave signal receiver over a wide range of variation of received signal strength, such control involving only the operating conditions of each such stage independently of the operating conditions of any other stages of the receiver.

A further object is to provide an automatic-gain-control system for a wave signal receiver including a transistor IF amplifier and which is adapted to stabilize the over-all signal gain and bandwidth of the receiver to a degree which is augmented by the D.-C. gain of the amplifier.

An automatic-gain-control system for a wave signal receiver in accordance with the invention comprises circuit means for translating the received signals. The system also comprises a transistor amplifier having an input circuit and an output circuit, means being provided for coupling the translated signal to such input circuit so as to cause the amplifier to produce a corresponding amplified signal in its output circuit. Signal by-pass means including a diode is connected across the input circuit for attenuating the translated signal therein to an extent governed by the conductance of the diode. The system also comprises detecting means by which a detected control bias dependent on the average amplitude of such amplified signal is applied to the amplifier to control the gain thereof and to also cause it to produce an amplified control bias in its output circuit. Finally, means are provided by which the amplified control bias is applied to the diode to control the conductance thereof. Such an automatic-gain-control system thereby stabilizes the amplitude of the amplified signal produced by the amplifier and the bandwidth of the receiver against variations in received signal strength, the degree of such stabilization being enhanced by the amplification of the detected control bias.

A more complete description of the invention, together with other objects and features thereof, is presented in the following specification and accompanying drawing noting, however, that the actual scope of the invention is pointed out by the appended claims.

*General*

Figures 1, 2:
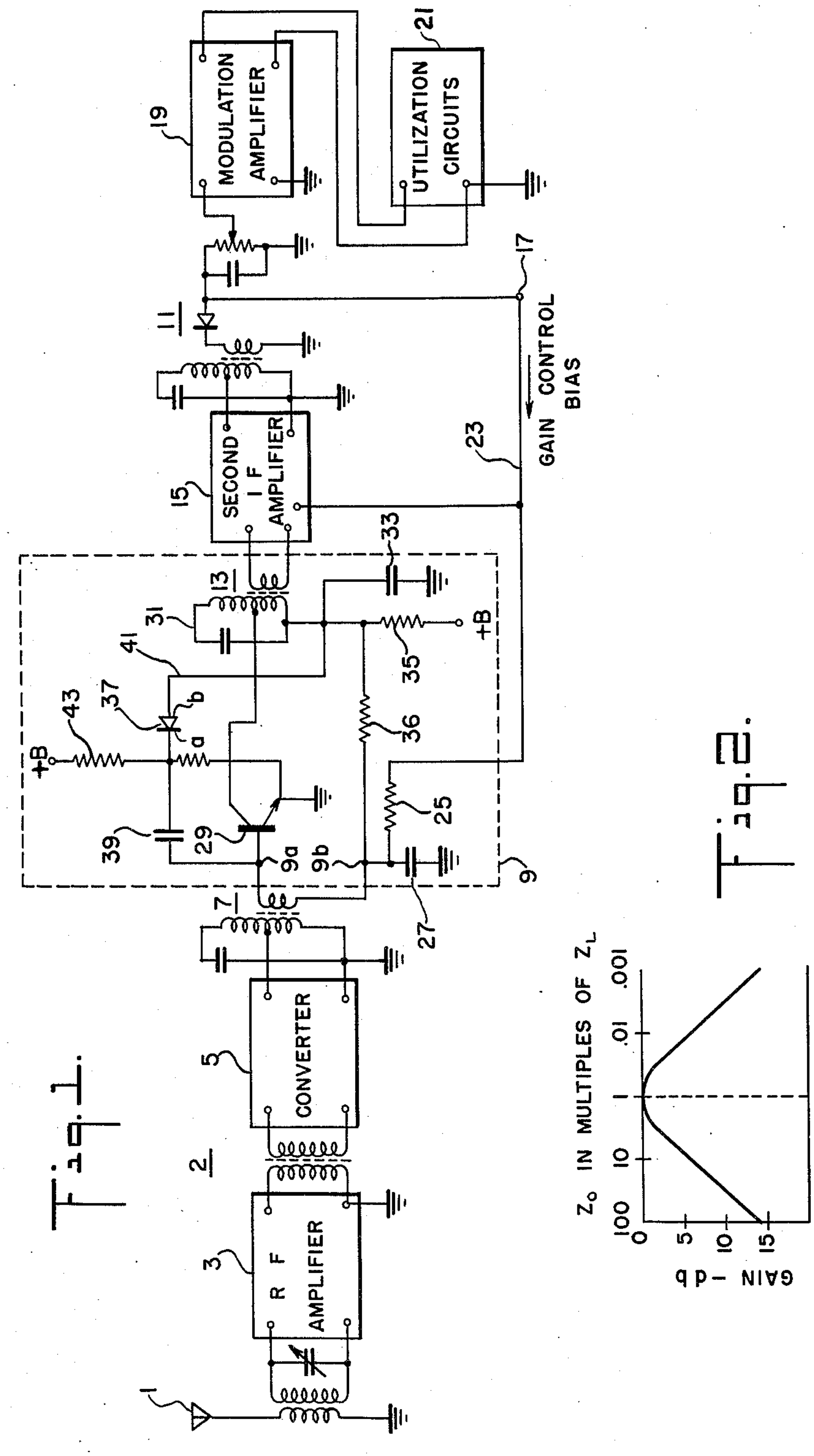
FIG. 1 is a circuit diagram of a particular embodiment of the invention.
FIG. 2 is a typical gain characteristic of a transistor amplifier in terms of the load impedance and the transistor output impedance.

Referring to the illustrated wave signal receiver circuit, a radio-frequency (RF) signal is received at the antenna 1 and is translated by circuit means 2 which may comprise an RF amplifier 3 and a converter 5. The latter shifts the frequency band of the translated signal so the carrier component thereof lies at a desired intermediate-frequency (IF). Since the invention is particularly adapted for use in a receiver of modulated carrier wave signals, the received and translated signals will usually be of that type. The modulation components may be audio alone, as in the case of a radio receiver, or may comprise both video and audio components as in the case of a television receiver. The type of modulation, e.g. AM or FM, is also immaterial to the invention. It may also be noted that the RF amplifier, while desirable, may be omitted in a low cost receiver.

The translated signal is then coupled by means such as an IF transformer 7 from the output of signal translating means 2 to the input circuit of a transistor amplifier 9, thus causing the latter to produce a corresponding amplified signal in its output circuit. This amplified signal is then applied to detecting means 11 which is responsive thereto to detect a gain-control bias dependent on the average signal amplitude. In particular, the output circuit of amplifier 9 may comprise the primary winding of another IF coupling transformer 13 for inductively coupling the amplified signal to a second IF amplifier 15 for further amplification prior to application to detecting means 11. Actually, any number of additional IF amplifier stages may be similary provided in cascade to obtain a desired degree of receiver sensitively. The number of stages employed will also depend somewhat on the desired frequency bandwidth of the receiver, successive interstage coupling transformers being tuned so as to establish a flat response over the desired band and a sharp attenuation at adjacent frequencies.

The detected control bias produced by detecting means 11 is provided at its output terminal 17. Since the average amplitude of a modulated carrier wave signal is the amplitude of the carrier component thereof, this bias will be proportional to the carrier amplitude and so to the signal strength. The modulation components of the amplified signal produced by amplifier 9 are also obtained by detecting means 11 and are applied to a suitable modulation amplifier 19. That is, amplifier 19 will be an audio amplifier in the case of a radio receiver and will be a video amplifier in the case of a television receiver. The resultant amplified modulation signals are then applied to appropriate utilization circuits 21 for reproducing the audio or video information represented thereby. The detected control bias, as obtained at terminal 17, is applied back to the input circuit of transistor amplifier 9 and, if desired, of amplifier 15, to respectively control the gains thereof. This may be effected by the conductor 23 and a filter such as that formed by resistor 25 and grounded by-pass capacitor 27 connected to input circuit terminal *9b* of amplifier 9. As will be subsequently described in more detail, amplifier 9 is constructed so the control bias applied to its input circuit causes it to produce an amplified control bias in its output circuit. The detected control bias at terminal 17 of detecting means 11 may also be applied to either or both of RF amplifier 3 and converter 5. In any case, its function is to stabilize the average or carrier component amplitude of the amplified signals produced at the output of the last IF amplifier against variations in received signal strength.

*Detailed Description of the Automatic-Gain-Control System*

The novel automatic-gain-control system of the illustrated wave signal receiver will now be described in detail with particular reference to its control of IF amplifier 9. While the latter has been illustrated as the first IF amplifier, it could, in fact, be located anywhere in the over-all IF amplifier cascade, signal translating circuit 2 being considered to comprise all stages preceding the signal coupling means 7. As indicated above, coupling means 7 may be an IF coupling transformer, in which case its primary winding will be connected to signal translating circuit means 2 and its secondary winding connected across terminals *9a* and *9b* of the input circuit of transistor amplifier 9 to apply the translated signal thereto. Amplifier 9 may comprise a junction transistor 29, the base of the latter being connected to input terminal *9a* and the emitter being grounded and coupled by way of the grounded by-pass capacitor 27 to input terminal *9b*. The emitter is thus effectively connected to terminal *9b* with respect to signal conduction, so that the translated signals which are inductively coupled to the input circuit are applied between the base and emitter. The output circuit of amplifier 9 is between the collector and emitter of transistor 29, an amplified output signal corresponding to that coupled to the input circuit being produced in the output circuit across the signal load 31 connected therein. Specifically signal load 31 may comprise the primary winding of an IF coupling transformer 13 together with a capacitor connected thereacross to tune the load to the selected IF. A tap of the latter winding is connected to the collector of transistor 29, while another terminal thereof is placed at signal ground potential by a by-pass capacitor 33. The signal load is thus effectively between the collector and emitter of transistor 29.

The output circuit of amplifier 9 also comprises a resistor 35 by which a selected direct operating potential +B is applied to the amplifier, resistor 35 being by-passed to ground by capacitor 33. The latter two elements thus serve as a D.-C. load across which the direct control bias applied to input terminal *9b* of amplifier 9 produces an amplified control bias. The resistance of this load, as determined by resistor 35, as well as the value of operating potential +B, may be selected to obtain a desired degree of control bias amplification. Since the load is by-passed as described, the foregoing D.-C. gain may be provided without affecting the signal gain of amplifier 9. Resistor 35 may be connected to one terminal of the signal load 31, so that the primary winding of output transformer 13 completes a D.-C. path to the collector of transistor 29. Resistor 35 may also be connected by a resistor 36 to input terminal *9b*, the secondary winding of input transformer 7 completing a D.-C. path to the base of transistor 29 to establish a forward bias thereat.

The construction of detecting means 11 and amplifier 9 is coordinated so that a change in the detected control bias resulting from a change in received signal strength changes the over-all gain of the amplifier in a direction which tends to maintain the amplitude of the amplified signal produced across signal load 31 substantially constant. Thus, in the illustrated circuit an increase in signal strength will tend to increase the amplitude of the translated signal in the input circuit of amplifier 9 and so also the amplitude of the amplified output signal. Transistor 29 is preferably a junction transistor and, as illustrated, may be type NPN. In addition, detecting means 11 is arranged so the control bias voltage it produces at terminal 17 becomes increasingly negative in response to increased signal strength. This more negative control bias is applied to the base of transistor 29, as described, and so reduces the forward bias initially supplied by source +B between the base and emitter. The consequent reduction in base bias results in an amplified reduction in collector bias current. By appropriate choice of the quiescent bias conditions, one effect of the reduced collector bias current will be to begin to reduce the current gain between the base and collector of transistor 29 after the control bias reaches a quiescent level corresponding to a selected received signal strength. The gain of amplifier 9 will then begin to fall off as a consequence of further increases in signal strength. A further consequence of reducing the collector bias current as described will be to increase the input and output impedances of the amplifier. If the quiescent operating condition is one wherein these impedances were more nearly matched to the impedances of the receiver circuits respectively coupled thereto, this will yield a still further reduction in net signal gain. This gain-control characteristic is shown by the curve in FIG. 2, wherein $Z_L$ is the load impedance and $Z_o$ is the output impedance of the transistor. Maximum gain corresponds to the case where these impedances match each other. It will be noted that the gain drops as $Z_o$ either increases or decreases from the matched value. The latter case corresponds to increasing forward bias with increasing signal strength, the initial bias being set so $Z_o$ at least equals $Z_L$. However, as this requires increasing power from the bias supply source, this mode of gain control is not usually employed.

The relatively broad top of the curve in FIG. 2 results in rather poor gain-control response when the selected quiescent bias condition corresponds to optimum impedance matching in the input and output circuits in the interest of obtaining maximum signal gain. Additionally, when the bias is reduced at higher signal levels the increased output impedance of the transistor tends to reduce the bandwidth of the amplifier so as to cause distortion of the high and low frequency modulation components of the amplified signal.

Enhanced automatic-gain-control is, however, obtained in the illustrated circuit embodiment of the invention by providing signal by-pass means including a semiconductor diode 37 connected across the input circuit of amplifier 9 for attenuating the translated signals therein to an extent governed by the conductance of the diode. Such signal by-pass means may also comprise the capacitor 39 connected in series between the output terminal 37a of diode 37 and the base of transistor 29, the diode input terminal 37b being returned to ground by another signal by-pass capacitor. The conductance of diode 37 is controlled by providing means which may include the conductor 41 for applying the amplified control bias produced across the D.-C. load comprising resistor 35 to the diode input terminal. By-pass capacitor 33 in the foregoing load then also serves as the mentioned signal ground return capacitor for diode 37. The means whereby the amplified control bias is applied to diode 37 may also include a voltage divider 43 by which a fraction of the supply potential +B is applied to the output terminal of the diode in opposition to the amplified control bias at its input terminal. This establishes a delay voltage which may be set to prevent the diode from conducting until the amplified control bias reaches a level corresponding to the selected quiescent operating condition referred to above. When the received signal strength increases beyond the value at which that occurs, diode 37 will become increasingly conductive and so will cause the translated signals in the input circuit of amplifier 9 to be increasingly attenuated by the by-pass means comprising capacitor 39, diode 37, conductor 41 and capacitor 33. The rate of such increase in signal attenuation relative to increasing received signal strength may be adjusted by means of resistor 35, since the resistance thereof alters the amplification of the detected control bias by amplifier 9. It may also be noted that the resistance of voltage divider 43 as well may be adjusted to effect some degree of modification of the attenuation characteristic. Additionally, if the signal by-pass path includes appreciable signal impedance that will also affect the degree of signal attenuation. Circuit variations of this type will be evident to those skilled in the art. In any case, the degree to which the A.G.C. system stabilizes the signal receiver against variations in received signal strength is augmented by the D.-C. gain of the controlled amplifier 9 so as to permit highly sensitive gain-control operation over a wide range of such variations.

As already mentioned, when the control bias applied to the base of transistor 29 increases it causes a reduction of the base and collector currents thereof and so increases its input and output impedances. This increases the "Q" or sharpness of resonance of the tuned circuits comprising IF interstage coupling transformers 7 and 13 respectively coupled to the input and output circuits of amplifier 9 and so reduces the associated frequency bandwidth. At the same time, however, the increased amplified control bias applied to diode 37 increases the conductance thereof and so reduces the impedance of the signal by-pass means connected across the input circuit of amplifier 9. These two effects of the control bias on the total input impedance of amplifier 9 are thus in opposition. The resistance of D.-C. load resistor 35 may be set so the degree of amplification of the control bias results in the impedance of the signal by-pass means dropping at a rate which just compensates for the rate at which the input impedances of transistor 29 rise as the control bias increases, the degree of the latter impedance change also being adjustable by selection of the supplied operating biases. The net input impedance will then remain substantially constant, thus helping to stabilize the bandwidth of the receiver. This may involve some sacrifice in gain stabilization, but the described adjustments will permit a sufficient range of associated degrees of gain and bandwidth stabilization to achieve a wide variety of over-all receiver gain-control characteristics. Note that the net impedance of amplifier 9 may be held constant, thus achieving bandwidth stabilization, while at the same time the ratio of the input impedance of transistor 29 to the impedance of the signal by-pass means comprising diode 37 may be increased so as to provide an increase in signal attenuation by the latter means. Good A.G.C. operation consistent with constant bandwidth can thus be closely approached.

It may also be noted that resistor 35 may be adjusted so the impedance of the signal by-pass means including diode 37 drops even more rapidly with increasing signal strength than the rate at which the input impedance of transistor 29 rises, thus tending to stabilize the bandwidth against the effect of the rising output impedance of the transistor as well as the rising input impedance thereof. Alternatively, if the succeeding IF amplifier 15 should also include signal by-pass gain-control circuitry in accordance with the invention, it may be adjusted so its input impedance drops at a rate which compensates for the rising output impedance of amplifier 9. This, together with the above-described adjustment for compensating for the rising input impedance thereof as the received signal increases, will then maintain a substantially constant overall bandwidth as well as an adequate degree of gain control.

Although the invention is not limited to any particular set of values of the various circuit components, typical values of the more significant components of the illustrated gain-control circuit are as follows:

| Capacitor | Microfarads | Resistor | Kilohms |
|---|---|---|---|
| 27 | .01 | 25 | 1.8 |
| 33 | .0047 | 35 | 2.2 |
| 39 | .01 | 36 | 33 |

While there has been described what is at present considered to be the preferred embodiment of the present invention, it will be obvious to those skilled in the art that various changes and modifications may be made therein without departing from the invention and it is, therefore, aimed to cover all such changes and modifications as fall within the true spirit and scope of the invention.

What is claimed is:

1. An automatic-gain-control system for a wave signal receiver, said system comprising: circuit means for translating the received signal; a transistor amplifier having an input circuit and an output circuit; means for coupling the translated signal to said input circuit to cause said amplifier to produce a corresponding amplified signal in its output circuit; signal detecting means for applying a detected control bias dependent on the average amplitude of said amplified signal to said amplifier to control the gain thereof and to also cause it to produce an amplified control bias in its output circuit; signal by-pass means including a diode connected across said input circuit for attenuating the translated signal therein to an extent governed by the conductance of said diode; and means for applying said amplified control bias to said diode to control the conductance thereof; whereby said automatic-gain-control system stabilizes the amplitude of said amplified signal and the bandwidth of said receiver against variations in received signal strength to a degree which is enhanced by the amplification of said control bias by said amplifier.

2. An automatic-gain-control system for a wave signal receiver, said system comprising: circuit means for translating the received signal; a transistor amplifier having an input circuit and an output circuit; means for coupling the translated signal to said input circuit to cause said amplifier to produce a corresponding amplified signal in its output circuit; signal detecting means for applying a detected control bias which increases with increasing average amplitude of said amplified signal to said amplifier to control the gain thereof and to also cause it to produce an amplified control bias in its output circuit; signal by-pass means including a diode connected across said input circuit for attenuating the translated signal therein to an extent governed by the conductance of said diode; and means for applying said amplified control bias to said diode to increase the conductance thereof as said amplified control bias increasingly exceeds a quiescent level corresponding to a selected received signal strength; whereby said automatic-gain-control system stabilizes the amplitude of said amplified signal and the bandwidth of said receiver against variations in received signal strength to a degree which is enhanced by the amplification of said control bias of said amplifier.

3. An automatic-gain-control system for a wave signal receiver, said system comprising: circuit means for translating the received signal; a transistor amplifier having an input circuit and an output circuit; means for coupling the translated signal to said input circuit to cause said amplifier to produce a corresponding amplified signal in its output circuit; a D.-C. load connected in said output circuit by which direct operating potential is supplied to said amplifier; signal detecting means for applying a detected control bias voltage which increases with increasing average amplitude of said amplified signal to said amplifier to control the gain thereof and to also cause it to produce an amplified control bias voltage across said D.-C. load; signal by-pass means including a diode connected across said input circuit for attenuating the translated signal therein to an extent governed by the conductance of said diode; and means for applying said amplified control bias voltage to said diode to increase the conductance thereof as that voltage increasingly exceeds a quiescent level corresponding to a selected received signal strength; whereby said automatic-gain-control system stabilizes the amplitude of said amplified signal and the total input impedance across said input circuit against variations in received signal strength to a degree dependent on the values of said supplied direct operating potential and the resistance of said D.-C. load.

4. An automatic-gain-control system for a wave signal receiver, said system comprising: circuit means for translating the received signal; a transistor amplifier having an input circuit and an output circuit; a coupling transformer having a primary winding connected to said signal translating circuit and a secondary winding connected to said input circuit for inductively coupling the translated signal thereto; a signal load connected to said output circuit for obtaining an amplified signal corresponding to the translated signal coupled to said input circuit; a D.-C. load connected in said output circuit for applying a selected direct operating potential to said amplifier, the D.C. gain of said amplifier being dependent on the resistance of said D.-C. load; signal detecting means for applying a detected control bias voltage which increases with the average amplitude of said amplified signal to said amplifier to control the gain thereof and to also cause it to produce an amplified control bias voltage across said D.-C. load; signal by-pass means including a diode connected across said input circuit for attenuating the translated signal therein to an extent governed by the conductance of said diode; and means for applying said amplified control bias voltage and an opposing delay voltage across said diode to render it increasingly conductive as the received signal strength increases beyond the level at which said amplified control bias voltage equals said delay voltage; whereby said automatic-gain-control system stabilizes the amplitude of said amplified signal and the total input impedance across said input circuit against variations in received signal strength to a degree dependent on said supplied direct operating potential and the resistance of said D.C. load.

5. An automatic-gain-control system for a modulated radio-frequency carrier wave signal receiver, said system comprising: frequency converting means for translating the received signal and converting it to a desired intermediate frequency; a transistor amplifier having an input circuit between its base and emitter and an output circuit between its collector and emitter; an IF coupling transformer having a primary winding connected to said frequency converting means and a secondary winding connected to said input circuit for inductively coupling the translated intermediate-frequency signal across said base and emitter; a signal load connected in said output circuit for obtaining an amplified intermediate-frequency signal corresponding to the translated intermediate-frequency signal coupled to said input circuit; a by-passed D.-C. load resistor connected to the collector of said amplifier for applying a selected direct operating potential thereto, the D.-C. gain of said amplifier being dependent on the resistance of said resistor; signal detecting means for applying a detected control bias voltage which increases with increasing amplitude of the carrier component of said amplified signal to said base to control the gain of said amplifier and to also cause it to produce an amplified control bias voltage across said resistor; signal by-pass means including a capacitor and a diode connected across said input circuit and having an intermediate-frequency impedance which drops when the conductance of said diode increases, thus increasingly attenuating the translated intermediate-frequency signal across said base and emitter; means for applying a delay voltage to said diode; and means for connecting said resistor to said diode to apply said amplified control bias voltage thereto in opposition to said delay voltage so as to increase the diode conductance as the received signal strength increases beyond the level at which said amplified control bias voltage equals said delay voltage; whereby the amplitude of said amplified signals is stabilized against variations in received signal strength by virtue of the change in impedance of said signal by-pass means by said amplified bias voltage, such impedance change also tending to compensate for changes in the input impedance between said base and emitter so as to stabilize the bandwidth of said receiver.

References Cited in the file of this patent

UNITED STATES PATENTS 2,774,866 Burger ---------------- Dec. 18, 1956